United States Patent
O et al.

(10) Patent No.: US 7,170,810 B1
(45) Date of Patent: Jan. 30, 2007

(54) STABLE PROGRAMMING CIRCUITRY FOR PROGRAMMABLE INTEGRATED CIRCUITS

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/153,987

(22) Filed: Jun. 16, 2005

(51) Int. Cl.
  *G11C 5/14* (2006.01)
  *G11C 11/34* (2006.01)
(52) U.S. Cl. ................... 365/226; 365/185.23
(58) Field of Classification Search ............... 365/226, 365/185.23, 189.09
  See application file for complete search history.

(56) References Cited

U.S. PATENT DOCUMENTS

| | | | |
|---|---|---|---|
| 4,837,459 A | 6/1989 | Bukowski et al. | |
| 5,889,720 A * | 3/1999 | Lisart et al. | 365/226 |
| 6,111,791 A * | 8/2000 | Ghilardelli | 365/185.28 |
| 6,335,893 B1 * | 1/2002 | Tanaka et al. | 365/226 |
| 6,337,828 B1 * | 1/2002 | Ooishi et al. | 365/226 |
| 6,661,713 B1 | 12/2003 | Kuo | |

* cited by examiner

*Primary Examiner*—Anh Phung
(74) *Attorney, Agent, or Firm*—G. Victor Treyz

(57) ABSTRACT

Voltage regulator circuitry is provided that produces a stable programming-voltage on a programmable integrated circuit. The programmable integrated circuit has programming control circuitry that provides logic-level programming signals. A controllable voltage supply increases the strength of the logic-level programming signals to produce programming-voltage-level programming signals. The programming-voltage-level programming signals are used to program programmable elements such as flash transistors on the programmable integrated circuit. A temperature-insensitive diode-based voltage feedback circuit is connected to the output of the controllable voltage supply. The voltage feedback circuit provides a corresponding feedback voltage to the controllable voltage supply that the controllable voltage supply used to stabilize the magnitude of the programming-voltage-level programming signals.

20 Claims, 12 Drawing Sheets

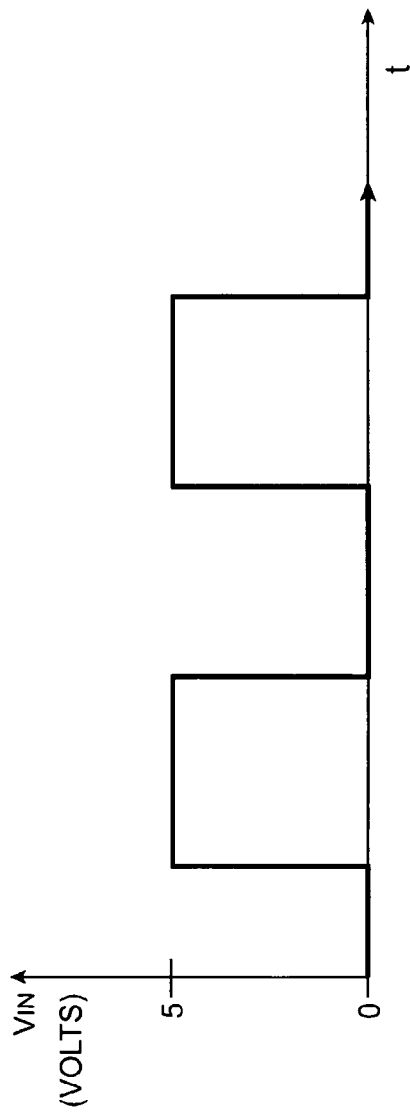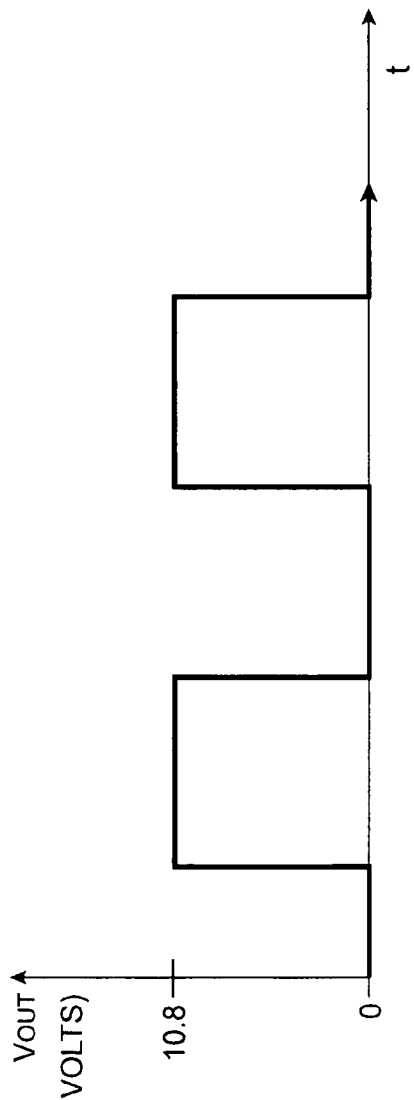

STABLE PROGRAMMING CIRCUITRY FOR PROGRAMMABLE INTEGRATED CIRCUITS

BACKGROUND

This invention relates to programming circuits for programmable integrated circuits, and more particularly, to temperature-insensitive voltage regulator circuitry that regulates programming voltages for programmable integrated circuits.

Programmable integrated circuits such as non-volatile memory devices and programmable logic devices contain programmable elements. The programmable elements are based on devices such as programmable read-only-memory (PROM) transistors, erasable programmable read-only-memory (EPROM) transistors, electrically-erasable programmable read-only-memory (EEPROM) transistors, programmable flash transistors, fuses or antifuses, etc. These programmable elements may be either programmed or unprogrammed. When unprogrammed, the elements produce outputs that are responsive to their inputs (i.e., they switch like normal transistors). When programmed, the elements are unresponsive to their inputs (i.e., they are in a fixed state, regardless of what input is applied).

Data can be stored in non-volatile memories by programming appropriate programmable elements. The programmed bits represent stored data. The states of the programmed elements can be sensed using suitable sensing circuitry.

Programmable logic devices use programmable elements to configure logic circuitry to perform a desired custom logic function. In a typical scenario, a logic designer uses computer-aided design (CAD) tools to design a custom logic circuit. These tools use information on the hardware capabilities of a given programmable logic device to help the designer implement the custom logic circuit with the resources available on that given programmable logic device. When the design process is complete, the CAD tools generate configuration data files. The configuration data is used to program the programmable elements on the programmable logic device. The states of the programmable elements are used to control the logic circuitry on the programmable logic device so that the logic circuitry performs the functions of the custom logic circuit design.

Modern integrated circuits operate with relatively low power supply voltages. Power supply voltages of 5 volts and less are generally used. Some commonly used power supply voltages for modern digital logic circuits include 3.3 volts and 2.5 volts. Sometimes the core logic in an integrated circuit is operated at even lower voltages such as 1.8 volts or 1.5 volts. It is expected that as process technology advances, it will be possible to reduce these power supply voltages even further.

Lower power supply voltages are generally desirable, because they reduce power consumption. However, low power supply voltages typically cannot be used to program programmable elements. For example, it is not uncommon for voltages of 10–11 volts to be required to program commonly-used flash transistors.

To produce programming voltages of sufficient magnitude to program the programmable elements, a charge pump circuit is used to boost the available power supply voltage to an appropriate programming level. The programming voltage produced by the charge pump must be regulated, so that it does not vary too much as a function of changes in manufacturing process, supply voltage, and operating temperature. If the programming voltage is not sufficiently stable, the programming operation will not be well defined and programming yields will suffer.

It is therefore an object of the present invention to provide voltage regulator circuitry for stabilizing the programming voltage levels produced on programmable integrated circuits.

SUMMARY

Circuitry is provided for programming programmable elements on programmable integrated circuits such as programmable logic device integrated circuits.

A programmable integrated circuit contains programmable elements such as flash transistors or other devices that are programmed by application of a relatively high programming voltage. The programming voltage is elevated with respect to the logic-level voltage signals that are normally used by the programmable integrated circuit when processing regular digital data.

Configuration data can be provided to programming control circuitry on the programmable integrated circuit from an external source. The programming control circuitry uses the configuration data to provide corresponding programming signals. The programming signals are provided as logic-level output signals. The voltage swing of the logic-level programming signals provided by the programming control circuitry is generally equal to the difference between the logic power supply voltage level (Vcc) and ground (Vss). This logic-level voltage swing is insufficient to directly program the programmable elements.

A controllable voltage supply receives the logic-level programming signals from the programming control circuitry and strengthens these signals to produce corresponding programming-voltage-level programming signals. The programming-voltage-level programming signals have a voltage swing equal to a programming voltage level (Vpp). The programming voltage is larger than the logic voltage level on the programmable integrated circuit.

The controllable voltage supply provides the programming-voltage-level programming signals at an output. A temperature-insensitive diode-based voltage feedback circuit 26 is connected to the output and provides a voltage feedback signal to the controllable voltage supply. The controllable voltage supply uses the voltage feedback signal to help provide a stable output.

The diode-based voltage feedback circuit preferably contains reverse-biased and forward-biased diodes connected in series between the output of the controllable voltage supply and a ground. A node in the series-connected diodes is connected to a feedback path. The voltage feedback signal is fed back to the controllable voltage supply over the feedback path.

The controllable voltage supply may be based on a charge pump. A comparator may compare the voltage feedback signal to a reference voltage. Corresponding output signals from the comparator may be provided to the charge pump to control the charge pump.

Further features of the invention, its nature and various advantages will be more apparent from the accompanying drawings and the following detailed description of the preferred embodiments.

BRIEF DESCRIPTION OF THE DRAWINGS

FIG. 3 is a graph of an illustrative logic control signal VIN that may be used to control the programming of programmable elements on the programmable integrated circuit in accordance with the present invention.

FIG. 4 is a graph showing how the programming voltage VOUT that is produced by the controllable voltage supply tracks the control signal VIN in accordance with the present invention.

DETAILED DESCRIPTION

The present invention relates to circuitry that produces stable programming voltages for programming programmable elements such as flash devices. The circuitry may be used on integrated circuits that contain programmable elements or on integrated circuits that are connected to integrated circuits that contain programmable elements (e.g., by virtue of being mounted on a common circuit board). The integrated circuits that contain the programmable elements may be programmable logic device integrated circuits, memory circuits, or any other suitable programmable integrated circuit.

Programmable logic devices are integrated circuits that can be configured by a user to perform custom logic functions. Programmable logic devices are configured ("programmed") by loading configuration data into the device. The configuration data is used to program the device's programmable elements. Once the programmable elements have been configured, they are used to produce static control signals that selectively turn on and off components of the device's circuitry and thereby customize the logic on the device.

Although the present invention may be used in the context of any integrated circuit that has programmable elements, such as memory chips, digital signal processors, microprocessors, and application specific integrated circuits, the invention is sometimes described in the context of programmable logic devices for clarity.

Figure 1:
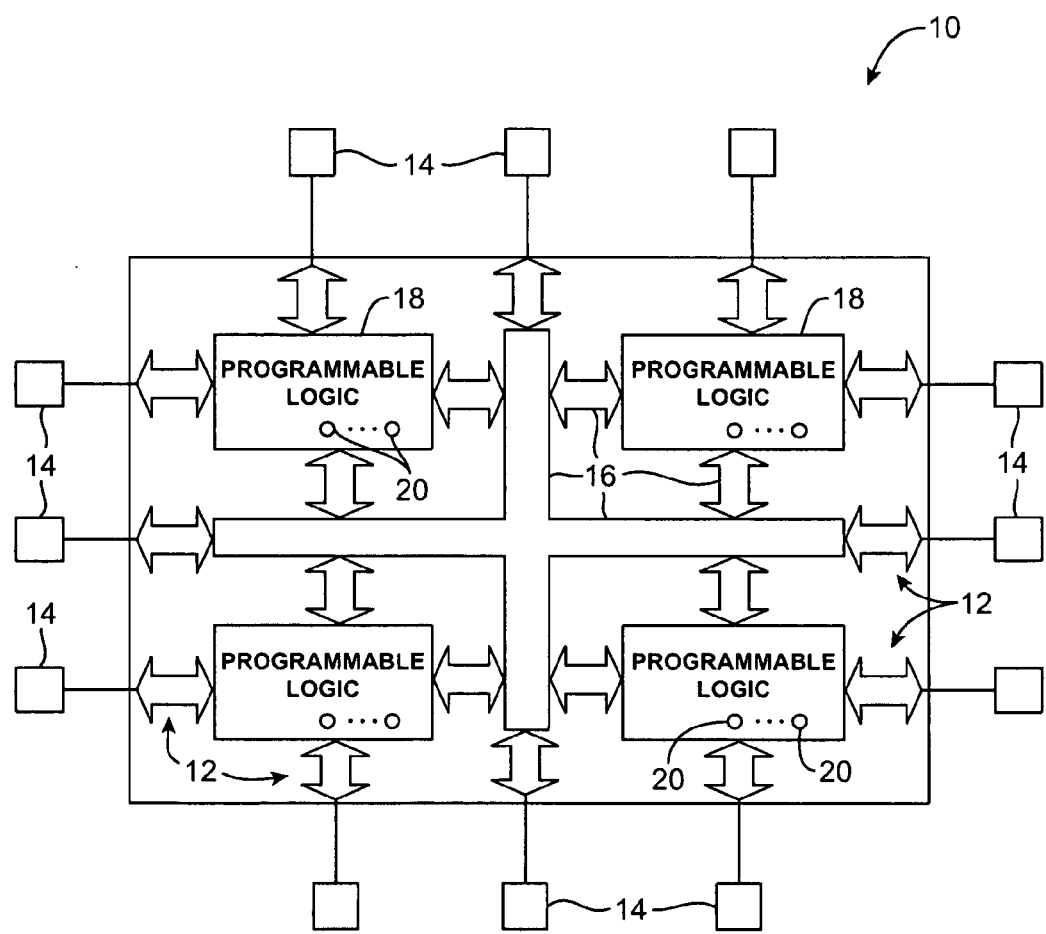
FIG. 1 is a diagram of an illustrative programmable logic device in accordance with the present invention.

An illustrative programmable logic device 10 containing programmable elements that may be programmed using the circuitry of the present invention is shown in FIG. 1.

Programmable logic device 10 may have input-output circuitry 12 for driving signals off of device 10 and for receiving signals from other devices via input-output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into the programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical arrangement, the programmable elements may be flash memory cells, EEPROM memory cells, memory cells based on fuses or antifuses, or other suitable devices that are programmed using programming signals at a programming voltage Vpp. Once programmed, the programmable elements provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Programmable logic circuit elements in input/output circuitry 12 and interconnection resources 16 are also generally configured by the programmable element outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

Illustrative programmable elements are shown schematically as elements 20 in FIG. 1.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired digital signal processing circuitry (e.g., multipliers, adders, etc.) may be used.

Integrated circuits such as programmable logic devices are generally powered by at least one positive power supply voltage (typically called Vcc) and a ground voltage (typically called Vss). The value of a typical Vcc voltage level is about 1–5 volts. The value of a typical ground Vss is 0 volts. Signals with a voltage swing of (Vcc-Vss) are sometimes referred to herein as logic-level signals.

In some integrated circuits, there may be multiple power supply voltages. For example, a relatively low core logic power supply voltage of 1.8 volts may be used to power the core logic on an integrated circuit, whereas a somewhat higher input-output voltage of 3.3 volts may be used by the input-output circuitry on the integrated circuit. This type of tiered power supply arrangement allows power consumption to be reduced by using a low power supply voltage to power much of the integrated circuit's resources, while obtaining benefits such improved noise immunity that result from using higher-voltage input-output circuitry. All of these voltage levels are generally lower than the programming voltage level (typically called Vpp) that is used to program flash transistors and other programmable elements on the integrated circuit. As an example, such programming voltages Vpp may be 10–11 volts.

As process technology improves, these voltage levels may become lower. For example, digital logic signals on integrated circuits are expected to have magnitudes of 1 volt or less. In this type of low voltage regime, the programming voltages may also be reduced (e.g., to 3–6 volts). The present invention is not restricted to operating with particular voltages. For clarity, however, the present invention will sometimes be described in the context of an example. In this illustrative example, digital logic signals have a magnitude of 5 volts (i.e., logic lows are represented by 0 volt signals and logic highs are represented by 5 volt signals). The programming voltage in the illustrative example is 10.8 volts.

Programmable integrated circuits may use power supply input pins to receive external power supply voltages at a core logic power supply level and at an input-output voltage supply level. To reduce complexity and avoid overburdening the system designer, however, programmable integrated circuits generally do not have a special power supply input pin for receiving an external power supply voltage of the correct magnitude for programming the programmable elements. Rather, charge pump circuitry on the programmable integrated circuit is used to generate the relatively large programming voltage levels that are required using a lower-level (logic-level) power supply voltage as an input.

In the present illustrative case, for example, the integrated circuit may have an input pin that receives a power supply voltage Vcc at 5 volts (and a ground Vss of 0 volts). The power supply voltage Vcc is used to power digital logic on the integrated circuit. The 10.8 volt programming-voltage-level programming signals that are used during programming of the programmable elements are generated from 5 volt logic-level programming signals using a charge pump or other suitable controllable voltage supply circuit.

Figure 2:
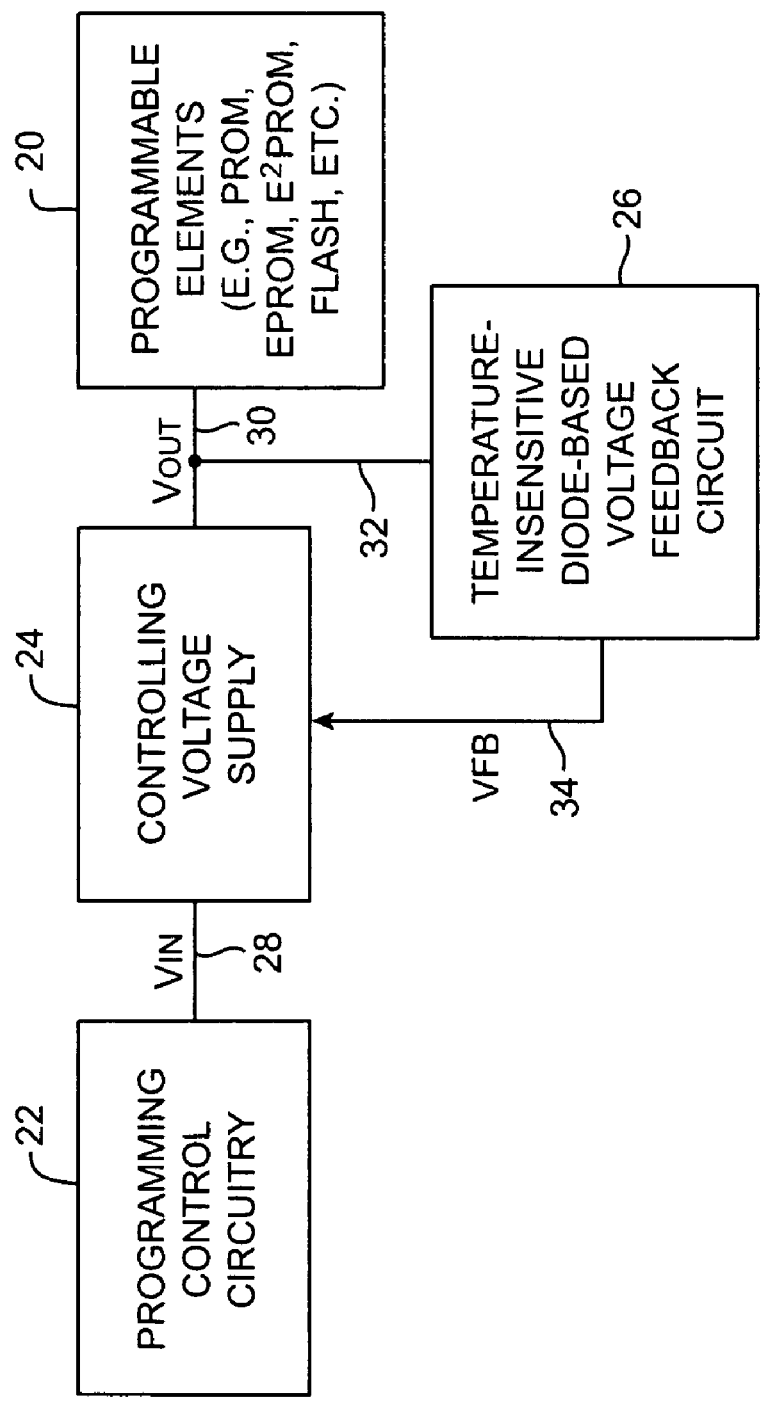
FIG. 2 is a diagram showing how a temperature-insensitive diode-based voltage feedback circuit can be used to supply a feedback signal to a controllable voltage supply circuit in accordance with the present invention.

An illustrative programming circuit arrangement that may be used is shown in FIG. 2. Programming control circuitry 22 provides logic-level programming signals VIN on path 28. The signals VIN range from a logic low level of Vss to a logic high level of Vcc. In general, there is at least one signal pulse for each bit of configuration data to be programmed into the programmable elements. If desired, pulse patterns may be used to program each bit.

Regardless of the format that is used, the VIN signals reflect the programming data that is to be programmed into programming elements 20. The programming signals may be based on configuration data that is provided to programming control circuitry 22 on device 10 from an external source.

Because the magnitude (voltage swing) of the logic-level programming signals is too small to program elements 20 directly, a controllable voltage supply 24 is used to increase the strength of the programming signals. The controllable voltage supply 24 strengthens the logic-level programming data on line 28 to produce programming data at a voltage level that is sufficiently high to program elements 20.

As shown in FIG. 2, the controllable voltage supply 24 receives signals VIN on line 28 and produces corresponding output signals VOUT on path 30. Unlike the logic-level signals on line 28, the programming-voltage-level signals VOUT on path 30 have a sufficiently high magnitude (voltage swing) to program programmable elements 20 directly. The signals VOUT range from Vss (e.g., when VIN is a logic low signal) to Vpp (e.g., when VIN is a logic high). Illustrative programming control signals VIN, ranging in voltage from a logic low of 0 volts to a logic high of 5 volts are shown in FIG. 3. Corresponding illustrative output signals VOUT of the type that may be produced at the output of controllable voltage supply 24 are shown in FIG. 4. As shown in FIG. 4, the signals VOUT in this example track the signals VIN, but are increased in magnitude to the programming voltage Vpp (e.g., 10.8 volts)

As shown in FIG. 2, a feedback path is formed by feedback path 32, temperature-insensitive diode-based voltage feedback circuit 26 and feedback path 34. This feedback arrangement provides feedback signals VFB to controllable voltage supply 24. The feedback signal VFB is typically a fraction of VOUT. The feedback signals are used to stabilize the magnitude of VOUT. If, for example, the magnitude of VOUT starts to become too large, the feedback signal VFB will rise, reflecting the rise in VOUT. The increased VFB signal level is fed back to controllable voltage supply 24 and directs voltage supply 24 to reduce its output voltage accordingly.

To ensure an accurate feedback arrangement, it is critical that the feedback circuit 26 that is used to monitor the output voltage VOUT is itself a stable circuit. In particular, it is important that circuit 26 be stable against changes induced by variations in the manufacturing process used to form the integrated circuit (process-induced variations), fluctuations in the power supply voltage Vcc used to power the integrated circuit (voltage variations), and changes in the operating temperature of the integrated circuit (temperature variations). By making circuit 26 insensitive to so-called process-voltage-temperature (PVT) fluctuations, the feedback process becomes more accurate and VOUT is stabilized. This enhances the yield of the programming process used to program elements 20.

Figure 5:
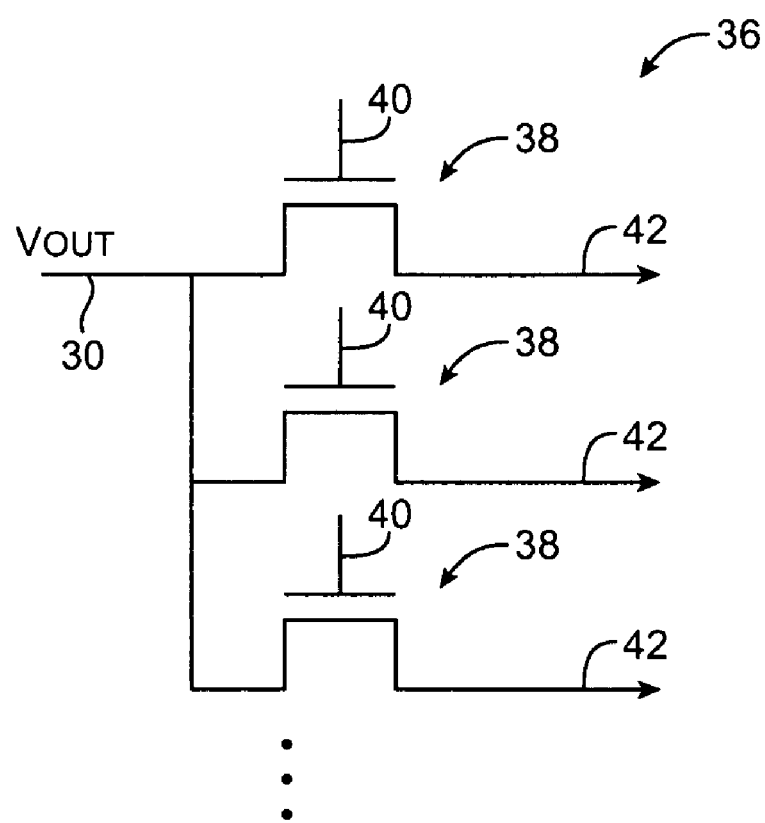
FIG. 5 is a circuit diagram showing how addressing circuitry can be used to apply the programming voltage to the desired programmable elements in accordance with the present invention.

In a typical scenario, there are numerous programmable elements 20 to be programmed. Addressing circuitry is therefore generally used to distribute the signal VOUT to appropriate programmable elements. If desired, the addressing circuitry can also modify the programming signals to facilitate programming. Illustrative addressing circuitry is shown in FIG. 5. The addressing circuit 36 of FIG. 5 has a series of parallel transistors 38. Each transistor is connected between the path 30 and a respective output path 42. The paths 42 can each be connected to a different programmable element or a different group of programmable elements.

Gates 40 are used to control which of the transistors 38 are active. If, for example, it is desired to program a programmable element associated with the middle transistor 38 of FIG. 5, the gate 40 that is used to control the middle transistor 38 will be taken high. This directs the programming signals VOUT from path 30 to the programmable elements connected to the line 42 that is associated with the middle transistor 38. The arrangement of FIG. 5 is merely illustrative. Any suitable addressing scheme may be used to direct the programming signals VOUT to appropriate programmable logic elements 20.

Figure 6:
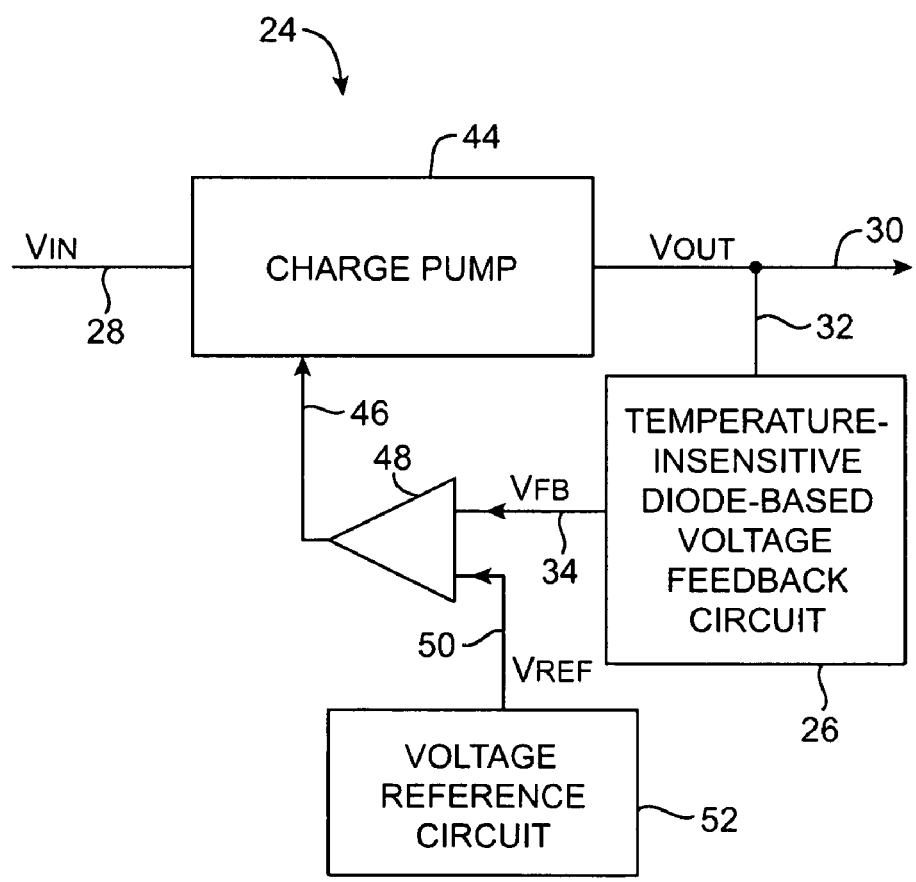
FIG. 6 is a circuit diagram of an illustrative embodiment of a controllable voltage supply with a temperature-insensitive diode-based voltage feedback circuit in accordance with the present invention.

The controllable voltage supply 24 of FIG. 2 may be implemented using any suitable controllable voltage supply circuit. One suitable arrangement is shown in FIG. 6. In the circuit of FIG. 6, the controllable voltage supply 24 is formed from a charge pump 44, a comparator 48, and a voltage reference 52. The charge pump circuit is controlled by a control signal applied at control input 46. If the control signal is high (as an example), the magnitude of the voltage VOUT that is produced at the output of the charge pump 44 is increased. If the control signal is low, the voltage VOUT is reduced.

Voltage reference 52 provides a voltage reference signal VREF on line 50. Comparator 48 compares the signals on its inputs 50 and 34. When VFB is larger than VREF, the output of comparator 48 is taken low, which directs charge pump 44 to reduce VOUT. When VFB is smaller than VREF, the output of comparator 48 is taken high, which directs charge pump 44 to increase VOUT.

Temperature-insensitive diode-based voltage feedback circuit 26 is a stable circuit that measures the voltage VOUT on line 32 and produces a proportional feedback signal VFB. Because circuit 26 uses diodes, it is not subject to process-induced performance variations that affect circuits based on devices such as metal-oxide-semiconductor transistors (e.g., variations due to changes in gate oxide thickness). No power supply voltage Vcc is used in circuit 26, so circuit 26 is also relatively immune to voltage variations. Back-to-back diodes are used in circuit 26. The back-to-back diodes are preferably constructed so that the temperature characteristics of the forward-biased diodes tend to cancel the temperature characteristics of the reverse-biased diodes. By balancing the diodes in circuit 26 in this way, temperature dependent effects are minimized.

Figure 7:
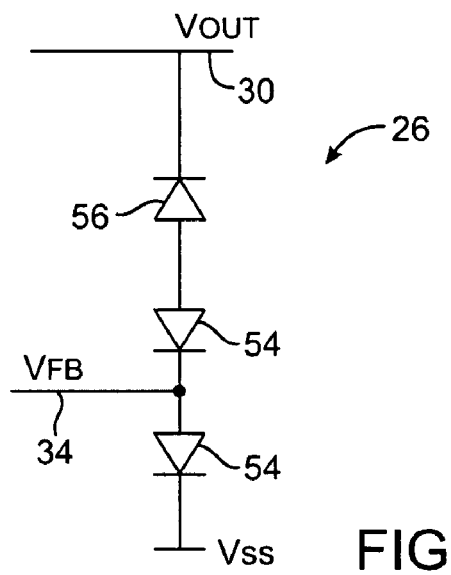
FIGS. 7 and 8 are circuit diagrams of illustrative temperature-insensitive diode-based voltage feedback circuits in accordance with the present invention.

An illustrative diode-based feedback circuit 26 is shown in FIG. 7. The illustrative feedback circuit 26 of FIG. 7 has two forward biased diodes 54 and one reversed biased diode 56 between VOUT line 30 and ground node Vss. The feedback signal VFB is provided at a node located between the two forward-biased diodes 54.

Figure 8:
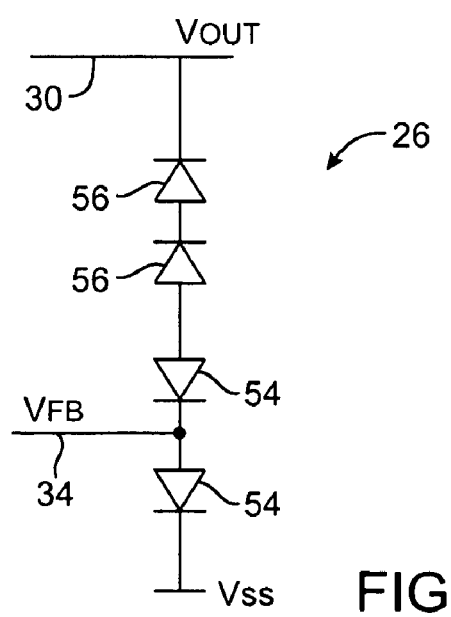

Another illustrative diode-based feedback circuit 26 is shown in FIG. 8. In the example of FIG. 8, there are a different number of diodes. In particular, there are two reverse-biased diodes 56 and two forward-biased diodes 54. In general, circuit 26 may use any suitable number of forward-biased diodes and any suitable number of reverse-biased diodes. The forward-biased diodes and reverse-biased diodes may be connected in any desired order and the tap point for the feedback signal may be made at any suitable location.

During operation of the diode-based feedback circuit 26, the forward-biased diodes are on and conduct current. The reverse-biased diodes are in reverse breakdown and conduct a reverse breakdown current. The series resistance of the feedback circuit is sufficiently large that the voltage VOUT does not sag.

Figure 9:
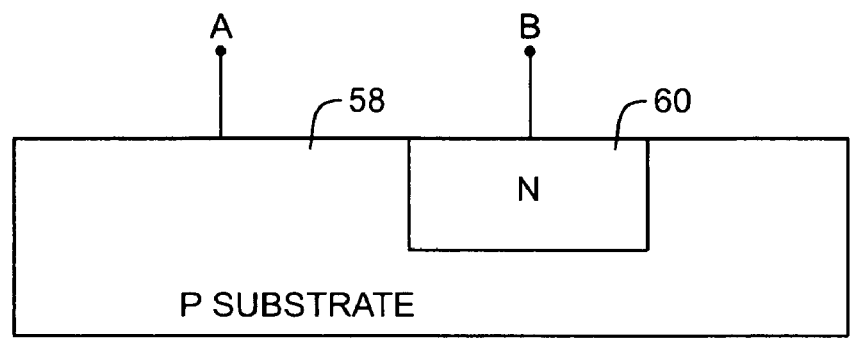
FIGS. 9 and 10 are cross-sectional side views of illustrative diodes that may be used in the temperature-insensitive diode-based voltage feedback circuits in accordance with the present invention.
Figure 10:
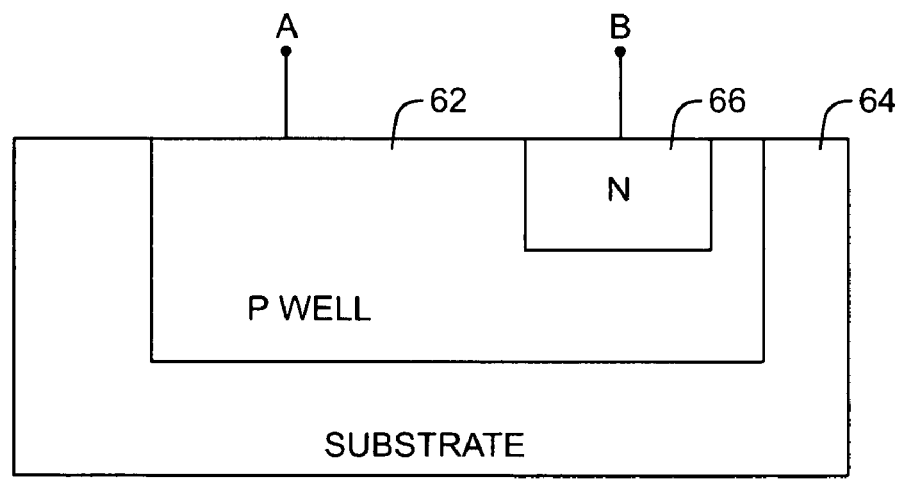

Cross-sections of illustrative diodes are shown in FIGS. 9 and 10. The two terminals of the diodes are labeled A and B. In the arrangement of FIG. 9, the p-type portion of the diode is formed as part of the semiconductor (silicon substrate) 58 and the n-type portion 60 of the diode is formed in substrate 58. In the arrangement of FIG. 10, a p-type well 62 is formed in the semiconductor substrate 64. N-type region 66 is formed in P well 62. The n-type and p-type regions form a p-n junction with an area A.

The forward-bias diode current $I_F$ of the forward-biased diodes can be approximated using equation 1.

$$I_F \approx A^* C^* \exp[(qV_F - E_G)/(kT)] \quad (1)$$

In equation 1, C is a material-dependent constant, q is the magnitude of the electron charge, $E_G$ is the semiconductor bandgap energy, k is Boltzmann's constant, T is the absolute temperature, and $V_F$ is the turn-on voltage of the diode. The relationship of equation 1 may be rewritten to produce equation 2.

$$qV_F \approx E_G - kT[(ln(A) + ln(C) - ln(I_F)] \quad (2)$$

Figure 11:
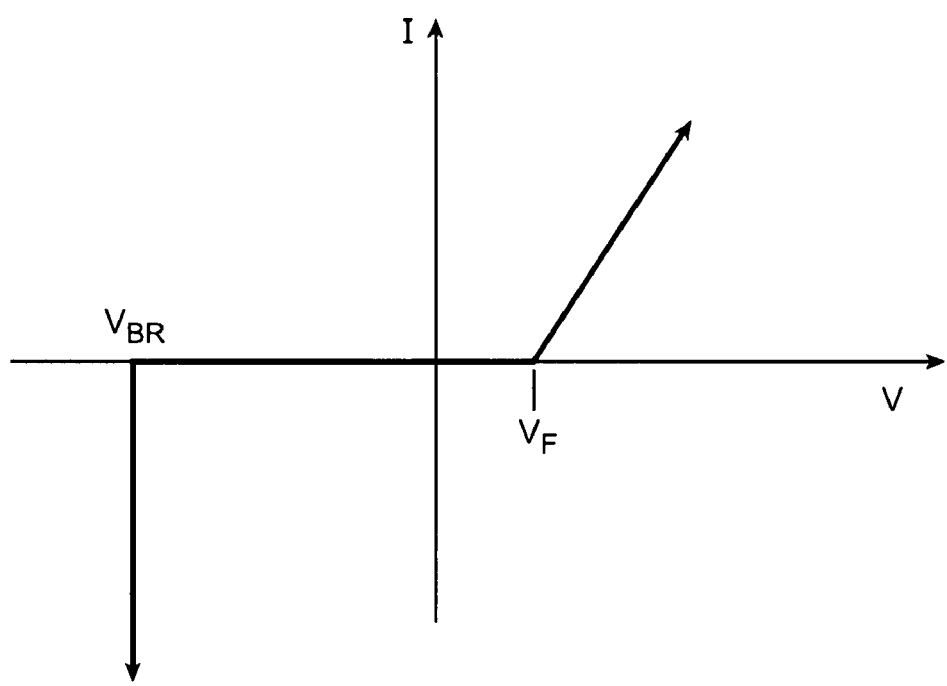
FIG. 11 is a graph of the current-voltage characteristic of a diode in the temperature-insensitive diode-based voltage feedback circuit in accordance with the present invention.

A graph of diode current I versus diode voltage V is shown in FIG. 11. In the forward direction I is referred to as $I_F$. As shown in the graph of FIG. 11, the diode does not conduct current at voltages below $V_F$. At $V_F$, the diode is said to "turn on" and conducts current. When a p-n diode is reverse biased sufficiently, the diode experiences reverse breakdown. The reverse breakdown voltage is labeled $V_{BR}$ in FIG. 11. At voltages with magnitudes less than the breakdown voltage $V_{BR}$, the diode does not conduct significant current. At reverse-bias voltage magnitudes greater than $V_{BR}$, there is a reverse-bias current, as shown in the graph of FIG. 11.

The magnitude of $V_{BR}$ controls how much reverse-bias current is produced for a given reverse-bias diode voltage.

The magnitude of $V_F$ controls the size of $I_F$ for the forward-biased diodes. During the design phase, the values of $V_{BR}$ and $V_F$ can be adjusted independently, which allows construction of a stable diode-based voltage feedback circuit 26.

Figure 12:
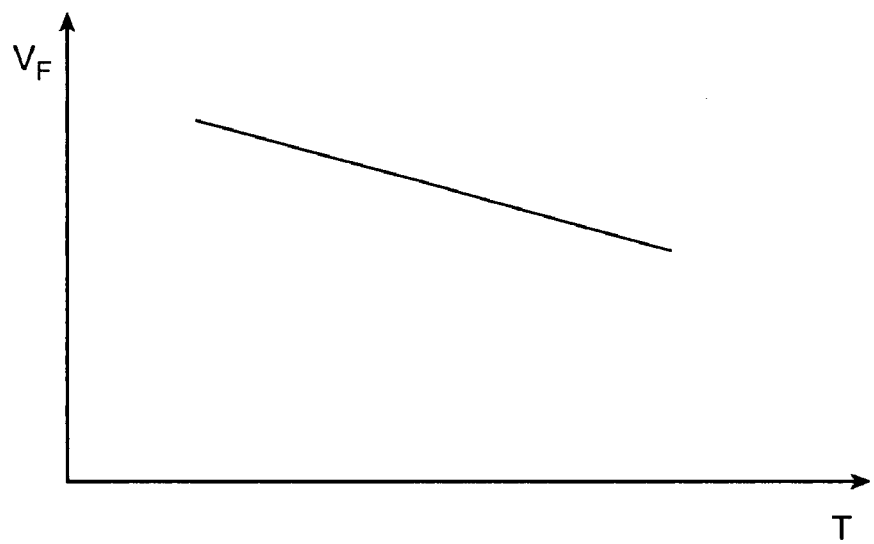
FIG. 12 is a graph showing the negative temperature dependence of the turn-on voltage $V_T$ of the diodes in the temperature-insensitive diode-based voltage feedback circuit in accordance with the present invention.

As represented by equation 2 and shown in the graph of FIG. 12, the turn-on voltage $V_F$ has a negative temperature dependence. As T rises, the value of $V_F$ falls. The amount by which $V_F$ drops per unit temperature T is dependent on the magnitude of A. If A is large, the diode will be the sensitive to temperature changes (i.e., the curve in FIG. 12 will be steep).

Figure 13:
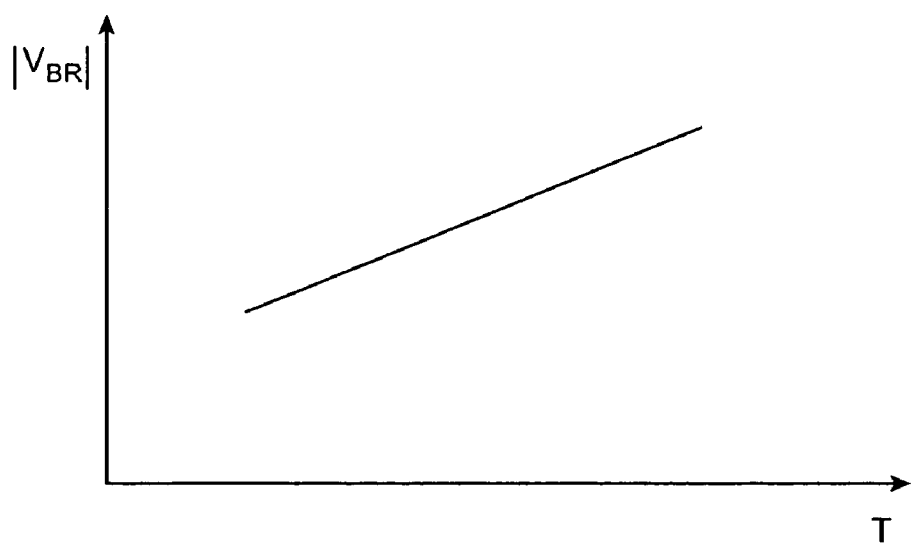
FIG. 13 is a graph showing the positive temperature dependence of the magnitude of the reverse breakdown voltage $V_{BR}$ of the diodes in the temperature-insensitive diode-based voltage feedback circuit in accordance with the present invention.

As shown in FIG. 13, as temperature T increases, the magnitude of the reverse-bias breakdown voltage $V_{BR}$ also increases. The magnitude of $V_{BR}$ and the sensitivity of $V_{BR}$ to changes in temperature (the slope of the curve in the graph of FIG. 13) are affected by the doping levels used for the n-type regions 60 and 66 and p-type regions 58 and 62 of FIGS. 9 and 10.

During the design phase, diode parameters such as doping levels and junction area are preferably adjusted so that the diodes in feedback circuit 26 are insensitive to temperature fluctuations. The graph of FIG. 14 shows how the output voltage VOUT varies when VOUT is controlled by two different circuits.

Figure 14:
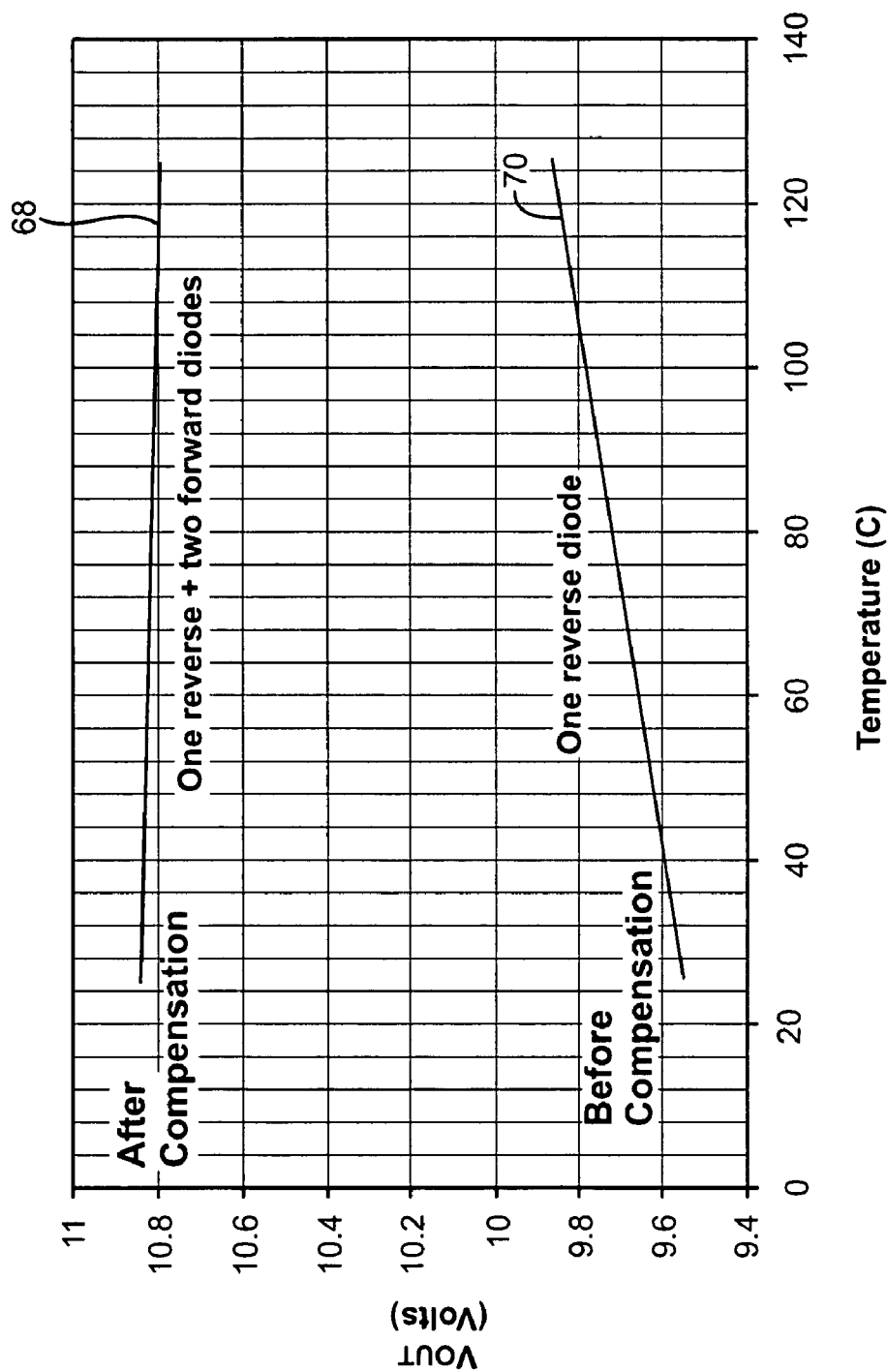
FIG. 14 is a graph illustrating the temperature dependent behavior of a controllable voltage supply controlled using a feedback voltage from a temperature-insensitive voltage feedback circuit in accordance with the present invention.

In FIG. 14, curve 68 corresponds to a circuit of the type shown in FIG. 2 in which the feedback circuit 26 is formed using a temperature-insensitive diode-based arrangement. In the example of FIG. 14, one reverse biased diode and two forward-biased diodes are used in the feedback circuit 26, as described in connection with the example of FIG. 7. During the design phase, the design parameters for the forward-biased diodes and the reverse-biased diode are selected so that the positive temperature dependence of the reverse-biased diode (FIG. 13) is compensated by the negative temperature dependence of the forward-biased diodes (FIG. 12). By balancing the temperature-dependent characteristics of the forward-biased diodes and the reverse-biased diodes in this way, the feedback circuit 26 is made insensitive to temperature. Because circuit 26 is insensitive to temperature, VOUT can be monitored accurately during the feedback process. As a result, temperature dependence of VOUT is minimized. Curve 68 of FIG. 14 is therefore flat over a wide range of operating temperatures T.

The curve 70 corresponds to a circuit arrangement in which the feedback circuit is formed using a single reverse-biased diode. Because there are no forward biased diodes in the feedback circuit for curve 70, the temperature dependence of $V_{BR}$ that was described in connection with FIG. 13 is not compensated. This feedback circuit is therefore not insensitive to temperature. As shown in the graph of FIG. 14, curve 70 varies substantially as a function of operating temperature.

In general, the values of VREF and VFB that are produced by the voltage reference circuit 52 and the feedback circuit 26 may be adjusted during the design phase. Design-phase adjustments may be made by changing doping concentrations. Doping adjustments may involve well-implant adjustments, lightly-doped drain implant adjustments, halo (angled) implant adjustments, etc. The area A of the diodes and the numbers of reverse-biased and forward biased diodes in the circuits can also be adjusted during the design phase. These design phase adjustments can be used by a circuit designer to configure the programming voltage circuit of FIG. 2 so that an appropriate programming voltage VOUT is produced. Design phase adjustments are also used to ensure that the properties of the reverse-biased and forward-biased diodes are balanced to compensate for changes in performance due to temperature fluctuations.

In addition to design-phase adjustments, the circuitry of FIG. 2 may, if desired, be adjusted by programming programmable elements 20 so that appropriate circuit adjustment control signals are produced. The control signals may, for example, be used to configure the circuitry so that desired values of VFB and therefore desired values of VOUT are produced. If desired, the output VREF of voltage reference circuit 52 (FIG. 6) may be adjusted by programming appropriate programmable elements 20, which provides another technique for adjusting VOUT and optimizing circuit performance for a given application.

Any suitable circuit may be used for the voltage reference circuit 52 that produces the voltage reference signal.

With one suitable arrangement, voltage reference circuit 52 may be formed using a bandgap reference circuit. Any suitable bandgap reference circuit may be used if desired.

With another suitable arrangement, voltage reference circuit 52 may be formed by placing a fixed or variable resistor in series with a forward-biased diode between positive power supply voltage Vcc and ground Vss. The node at which the voltage reference signal VREF is produced may be located between the resistor and the forward-biased diode. The forward-biased diode in this type of circuit ensures that no current flows into the Vcc node during transient conditions (i.e., during power-up). If a variable resistor is used, the value of the resistor can be controlled by programming appropriate programmable elements 20. The programmable elements 20 produce control signals that adjust the resistor value. By adjusting the resistor value, the value of VREF can be adjusted (e.g., to adjust VOUT).

Another suitable arrangement involves using a voltage reference circuit 52 formed from forward-biased and reverse-biased diodes. This type of voltage reference circuit may be insensitive to PVT fluctuations and may, if desired, be constructed to match the temperature performance of temperature-insensitive diode-based voltage feedback circuit 26. An example of a voltage reference circuit formed from reverse-biased and forward-biased diodes is shown in FIG. 15.

Figure 15:
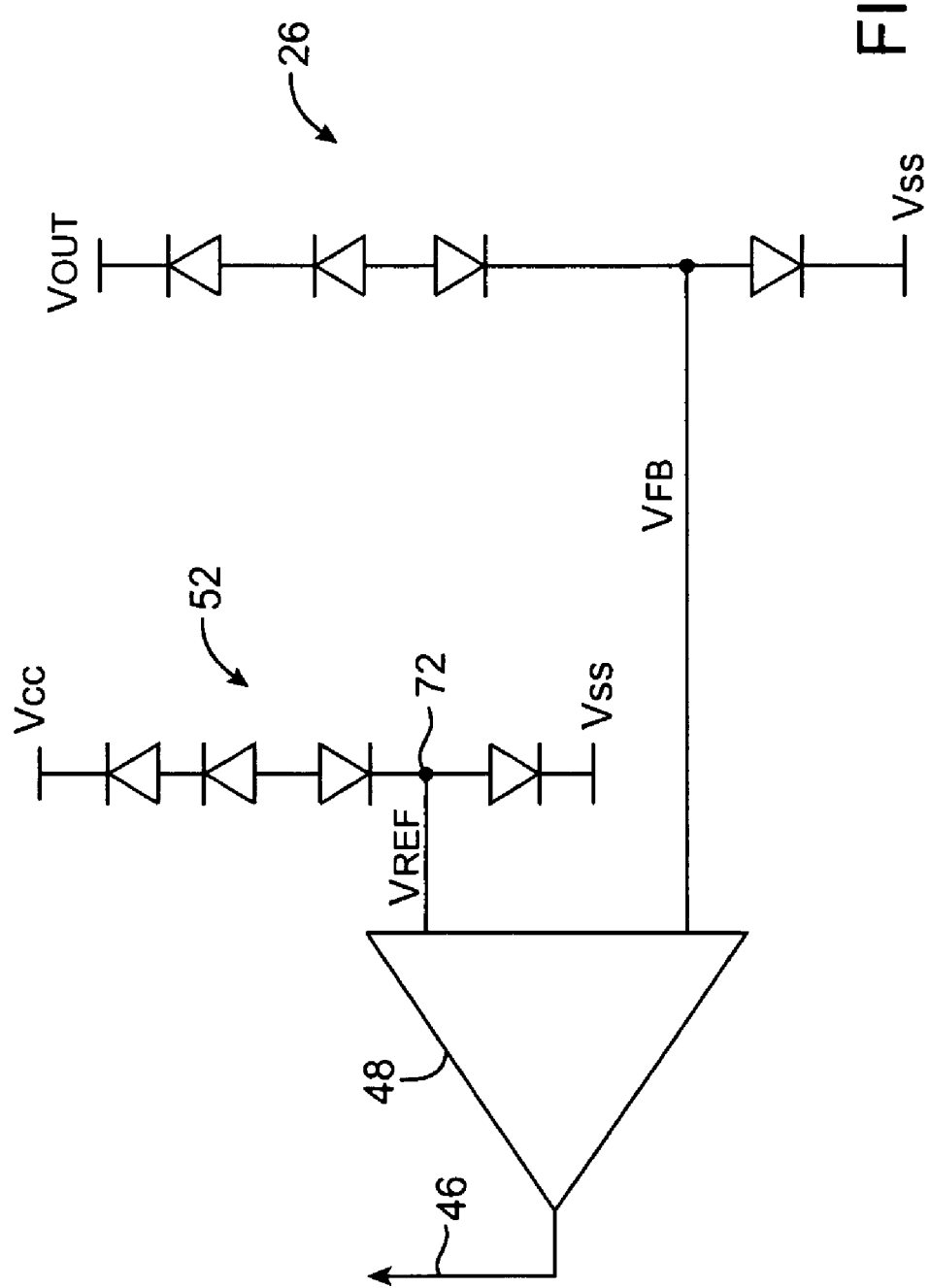
FIG. 15 is a circuit diagram of an illustrative feedback circuit using a diode-based reference voltage circuit and a diode-based voltage feedback circuit in accordance with the present invention.

In the example of FIG. 15, the voltage reference circuit 52 has two reverse-biased and two forward-biased diodes. The voltage reference signal VREF is produced at a node 72 that lies between the two forward-biased diodes. The reverse-biased diodes and forward-biased diodes are connected in series between positive power supply voltage Vcc and ground Vss. The reference voltage VREF is fed to one of the inputs of comparator 48. The other input of comparator 48 receives the feedback signal VFB from the temperature-insensitive diode-based voltage feedback circuit 26. The resulting control signal produced at the output 46 of comparator 48 directs the charge pump 44 (FIG. 6) to increase or decrease its output voltage as needed so that a stable value of VOUT is produced on line 30 (FIG. 6).

These examples of voltage reference circuits 52 are merely illustrative. Any suitable voltage reference circuit design may be used for producing VREF if desired. The voltage reference circuit may be fixed (i.e., the value of VREF may be fixed and not adjustable by programming) or may be adjustable (i.e., the value of VREF may be adjusted by programming suitable programmable elements 20).

If desired, the feedback voltage VFB may be adjusted by programming. By making the feedback voltage VFB adjustable in this way, the user of the programmable integrated circuit 10 can make adjustments to VOUT as needed (e.g., to accommodate different types of programmable elements 20). Adjustments to VFB may be made using any suitable adjustable feedback circuit arrangement. An example of a multiplexer-based temperature-insensitive diode-based voltage feedback circuit 26 is shown in FIG. 16.

Figure 16:
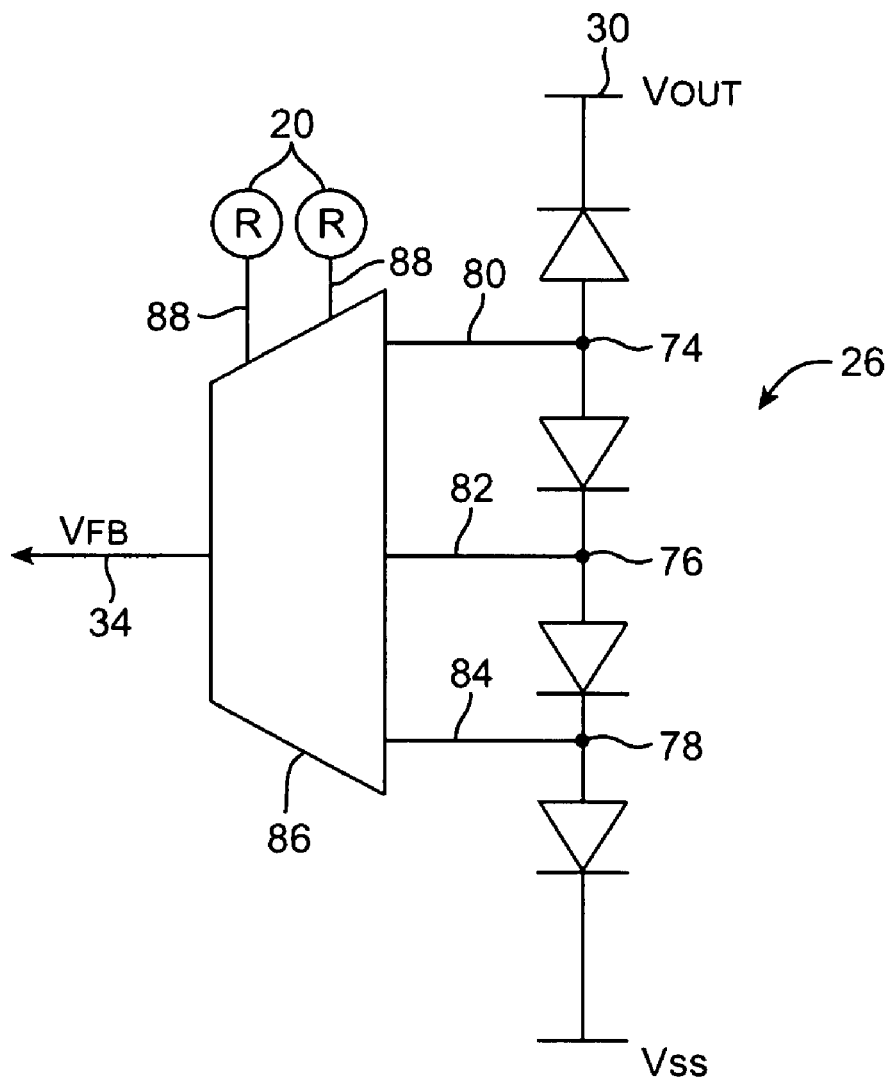
FIG. 16 is an illustrative programmable diode-based circuit that may be used to produce a programmable reference voltage or programmable feedback voltage for controlling the controllable voltage supply in accordance with the present invention.

In the example of FIG. 16, circuit 26 has a multiplexer 86. The multiplexer is adjusted by control signals applied via control lines 88. The control signals are produced by programmable elements 20. By adjusting the states of elements 20 (e.g., by loading appropriate configuration data into these elements during device programming at a manufacturer), the states of the control signals on lines 88 may be adjusted. In the example of FIG. 16, two programmable elements 20 are used to control the state of multiplexer 86. This is merely illustrative. Any suitable number of programmable elements 20 may be used to control the multiplexer. For example, a two-input multiplexer can be controlled by a single programmable element or an eight-input multiplexer may be controlled using three programmable elements. The programmable elements used to adjust the programming circuitry such as feedback circuit 26 may be based on any suitable programmable technology.

The control signals on lines 88 direct multiplexer 86 to connect a given one of its inputs to its output. In the example of FIG. 16, there are three input lines 80, 82, and 84. Input 80 is connected to node 74 in the diode stack formed from the reverse-biased and forward-biased diodes. Inputs 82 and 84 are connected to nodes 76 and 78 respectively. The diodes in circuit 26 are connected in series between output line 30 and ground Vss, as described in connection with FIGS. 7 and 8. If it is desired to produce a relatively high feedback voltage VFB, the multiplexer 86 is adjusted to connect input 80 to line 34. If it is desired to produce a relatively low feedback voltage VFB, multiplexer 86 is directed to connect input 84 to line 34. An intermediate value of VFB may be produced by adjusting multiplexer 86 so that node 76 and line 82 are connected to line 34.

If desired, both the feedback circuit 26 and the voltage reference circuit 52 may be adjustable. Adjustments may be made by setting the states of associated programmable elements. With another suitable arrangement, the feedback circuit 26 and the voltage reference circuit 52 are not adjustable. Another suitable arrangement has a non-adjustable feedback circuit 26 and an adjustable voltage reference circuit 52. If desired, the feedback circuit 26 may be adjustable and the voltage reference circuit 52 may be fixed.

The foregoing is merely illustrative of the principles of this invention and various modifications can be made by those skilled in the art without departing from the scope and spirit of the invention.

What is claimed is:

1. A circuit that produces programming-voltage-level programming signals having a programming-voltage-level voltage swing to program programmable elements on a programmable integrated circuit, comprising:
   programming control circuitry that provides logic-level programming signals having a logic-level voltage swing;
   a controllable voltage supply that uses the logic-level programming signals to produce the programming-voltage-level programming signals, wherein the programming-voltage-level programming voltage swing is larger than the logic-level voltage swing; and
   a temperature-insensitive diode-based feedback circuit that uses the programming-voltage-level programming signals to produce a voltage feedback signal that controls the controllable voltage supply.

2. The circuit defined in claim 1 wherein the temperature-insensitive diode-based feedback circuit comprises series-connected forward-biased and reverse-biased p-n diodes formed without using transistor structures.

3. The circuit defined in claim 1 wherein the controllable voltage supply has a voltage supply output at which the programming-voltage-level programming signals are provided, wherein the temperature-insensitive diode-based feedback circuit comprises at least two forward-biased diodes and at least one reverse-biased diode, and wherein the forward-biased and reversed-biased diodes are connected in series between the voltage supply output and a ground node.

4. The circuit defined in claim 1 wherein the controllable voltage supply has a voltage supply output at which the programming-voltage-level programming signals are provided, wherein the temperature-insensitive diode-based feedback circuit comprises at least two forward-biased diodes and at least one reverse-biased diode, wherein the forward-biased and reversed-biased diodes are connected in series between the voltage supply output and a ground node, wherein the temperature-insensitive diode-based feedback circuit provides the voltage feedback signal to the controllable voltage supply over a feedback path, and wherein the feedback path is electrically coupled to a node located between two of the forward-biased diodes.

5. The circuit defined in claim 1 wherein the controllable voltage supply comprises a comparator having first and second inputs, wherein the first comparator input receives a reference voltage, and wherein the second comparator input receives the voltage feedback signal.

6. The circuit defined in claim 1 wherein the controllable voltage supply comprises a charge pump that is controlled based on the voltage feedback signal.

7. The circuit defined in claim 1 wherein the controllable voltage supply comprises:
   a comparator having first and second inputs and an output, wherein the first comparator input receives a reference voltage, the second comparator input receives the voltage feedback signal, and the comparator provides a control signal on the output based on the reference voltage and the voltage feedback signal; and
   a charge pump that is controlled by the control signal from the output of the comparator.

8. The circuit defined in claim 1 wherein the controllable voltage supply comprises:
   a voltage supply output at which the programming-voltage-level programming signals are provided, wherein the temperature-insensitive diode-based feedback circuit comprises at least two forward-biased diodes and at least one reverse-biased diode, wherein the forward-biased and reversed-biased diodes are connected in series between the voltage supply output and a ground node, wherein the temperature-insensitive diode-based feedback circuit provides the voltage feedback signal to the controllable voltage supply over a feedback path, and wherein the feedback path is electrically coupled to a node located between two of the forward-biased diodes;
   a comparator having first and second inputs and an output, wherein the first comparator input receives a reference voltage, the second comparator input is connected to the feedback path and receives the voltage feedback signal, and wherein the comparator provides a control signal on the output based on a comparison of the reference voltage and the voltage feedback signal by the comparator; and a charge pump that is controlled by the control signal from the output of the comparator.

9. The circuit defined in claim 1 wherein the controllable voltage supply comprises:
a voltage supply output at which the programming-voltage-level programming signals are provided, wherein the temperature-insensitive diode-based feedback circuit comprises at least two forward-biased diodes and at least one reverse-biased diode, wherein the forward-biased and reversed-biased diodes are connected in series between the voltage supply output and a ground node, wherein the temperature-insensitive diode-based feedback circuit provides the voltage feedback signal to the controllable voltage supply over a feedback path, and wherein the feedback path is electrically coupled to a node located between two of the forward-biased diodes;
a voltage reference circuit having at least one forward-biased diode and at least one reverse-biased diode connected in series between a positive power supply voltage node and the ground node, wherein the positive power supply voltage is less than the programming-voltage-level voltage swing;
a comparator having first and second inputs and an output, wherein the first comparator input receives a reference voltage from the voltage reference circuit, the second comparator input is connected to the feedback path and receives the voltage feedback signal, and wherein the comparator provides a control signal on the output based on a comparison of the reference voltage and the voltage feedback signal by the comparator; and
a charge pump that is controlled by the control signal from the output of the comparator.

10. The circuit defined in claim 1 wherein the controllable voltage supply comprises:
a voltage supply output at which the programming-voltage-level programming signals are provided, wherein the temperature-insensitive diode-based feedback circuit comprises at least two forward-biased diodes and at least one reverse-biased diode, wherein the forward-biased and reversed-biased diodes are connected in series between the voltage supply output and a ground node, wherein the temperature-insensitive diode-based feedback circuit provides the voltage feedback signal to the controllable voltage supply over a feedback path, and wherein the feedback path is electrically coupled to a node located between two of the forward-biased diodes in the temperature-insensitive diode-based feedback circuit;
a voltage reference circuit having at least two forward-biased diodes and at least one reverse-biased diode connected in series between a positive power supply voltage node and the ground node, wherein a reference voltage path is connected to a node located between the two forward-biased diodes in the voltage reference circuit;
a comparator having first and second inputs and an output, wherein the first comparator input receives a reference voltage from the voltage reference circuit over the reference voltage path, the second comparator input is connected to the feedback path and receives the voltage feedback signal, and wherein the comparator provides a control signal on the output based on a comparison of the reference voltage and the voltage feedback signal by the comparator; and
a charge pump that is controlled by the control signal from the output of the comparator.

11. The circuit defined in claim 1 wherein the temperature-insensitive diode-based feedback circuit comprises forward-biased and reverse-biased diodes connected in series, wherein the forward-biased and reverse-biased diodes have respective temperature-dependences that compensate each other to stabilize the diode-based feedback circuit against fluctuations in temperature.

12. The circuit defined in claim 1 wherein the controllable voltage supply has a voltage supply output, wherein the temperature-insensitive diode-based feedback circuit comprises forward-biased and reverse-biased diodes connected in series between the voltage supply output and a ground node, wherein the temperature-insensitive diode-based feedback circuit provides the voltage feedback signal to the controllable voltage supply over a feedback path, wherein the feedback path is electrically coupled to a node located between two of the forward-biased diodes, and wherein the forward-biased diodes and reverse-biased diodes have respective temperature-dependences that compensate each other to stabilize the voltage feedback signal against fluctuations in temperature.

13. The circuit defined in claim 1 wherein the temperature-insensitive diode-based feedback circuit comprises p-n junction diodes each having a p-type region and an n-type region to which diode terminals are connected and wherein the n-type regions are each formed within a respective one of the p-type regions.

14. The circuit defined in claim 1 further comprising a feedback path connected between the temperature-insensitive diode-based feedback circuit and the controllable voltage supply, wherein the controllable voltage supply has a voltage supply output, wherein the temperature-insensitive diode-based feedback circuit comprises at least one reverse-biased diode and at least two forward-biased diodes formed without transistor structures, wherein the reverse-biased and forward-biased diodes are connected in series between the voltage supply output and a ground node, wherein the temperature-insensitive diode-based feedback circuit provides the voltage feedback signal to the controllable voltage supply over the feedback path, wherein the feedback path is electrically coupled to a node located between two of the forward-biased diodes, and wherein the forward-biased diodes and reverse-biased diodes have respective temperature-dependences that compensate each other to stabilize the voltage feedback signal against fluctuations in temperature.

15. The circuit defined in claim 1 wherein the controllable voltage supply has a voltage supply output, the circuit further comprising addressing circuitry that distributes the programming-voltage-level programming signals to the programmable elements.

16. The circuit defined in claim 1 further comprising control lines that provide control signals to the temperature-insensitive diode-based feedback circuit to adjust the temperature-insensitive diode-based feedback circuit.

17. The circuit defined in claim 1 wherein the temperature-insensitive diode-based feedback circuit comprises a multiplexer having an output that provides the voltage feedback signal to the controllable voltage source.

18. The circuit defined in claim 1 wherein the controllable voltage source comprises a charge pump and a comparator, wherein the comparator has an output connected to the charge pump that controls the charge pump and has first and second comparator inputs, wherein the first comparator input receives a voltage reference signal, and wherein the temperature-insensitive diode-based feedback circuit comprises a multiplexer having an output that provides the voltage feedback signal to second comparator input.

19. The circuit defined in claim 1 wherein the controllable voltage source comprises a charge pump and a comparator, wherein the comparator has an output connected to the charge pump that controls the charge pump and has first and second comparator inputs, wherein the first comparator input receives a voltage reference signal, wherein the temperature-insensitive diode-based feedback circuit comprises a multiplexer having an output that provides the voltage feedback signal to the second comparator input, wherein the multiplexer receives control signals from at least some of the programmable elements, and wherein the multiplexer comprises inputs that are connected to nodes in the temperature-insensitive diode-based feedback circuit.

20. The circuit defined in claim 1 wherein the programmable integrated circuit is a programmable logic device, wherein the controllable voltage source comprises a charge pump and a comparator, wherein the comparator has an output connected to the charge pump that controls the charge pump and has first and second comparator inputs, wherein the first comparator input receives a voltage reference signal, and wherein the temperature-insensitive diode-based feedback circuit comprises a multiplexer having an output that provides the voltage feedback signal to the second comparator input, wherein the temperature-insensitive diode-based feedback circuit comprises at least one reverse-biased diode and a plurality of forward-biased diodes formed without transistor structures, wherein the reverse-biased and forward-biased diodes are connected in series between the voltage supply output and a ground node, wherein the multiplexer receives control signals from at least some of the programmable elements, and wherein the multiplexer comprises inputs that are connected to nodes in the temperature-insensitive diode-based feedback circuit that are located between respective pairs of the diodes.

* * * * *